United States Patent
Tsujita et al.

(10) Patent No.: US 10,353,161 B2
(45) Date of Patent: Jul. 16, 2019

(54) OPTO-ELECTRIC HYBRID BOARD AND METHOD OF MANUFACTURING SAME

(71) Applicant: NITTO DENKO CORPORATION, Ibaraki-shi, Osaka (JP)

(72) Inventors: Yuichi Tsujita, Ibaraki (JP); Naoyuki Tanaka, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/516,737

(22) PCT Filed: Oct. 9, 2015

(86) PCT No.: PCT/JP2015/078819
§ 371 (c)(1),
(2) Date: Apr. 4, 2017

(87) PCT Pub. No.: WO2016/063751
PCT Pub. Date: Apr. 28, 2016

(65) Prior Publication Data
US 2017/0285284 A1    Oct. 5, 2017

(30) Foreign Application Priority Data
Oct. 24, 2014 (JP) .................... 2014-217132

(51) Int. Cl.
*G02B 6/43* (2006.01)
*G02B 6/42* (2006.01)
(Continued)

(52) U.S. Cl.
CPC ............... *G02B 6/43* (2013.01); *G02B 6/13* (2013.01); *G02B 6/4214* (2013.01);
(Continued)

(58) Field of Classification Search
CPC ..... G02B 6/13; G02B 6/42; G02B 6/43; G02B 6/4281; G02B 6/4214; G02B 6/3608; H01L 25/167; H01L 23/5389
(Continued)

(56) References Cited

U.S. PATENT DOCUMENTS 8,142,672 B2    3/2012  Hodono
8,611,704 B2   12/2013  Yasuda et al.
(Continued)

FOREIGN PATENT DOCUMENTS

CN    103837932 A    6/2014
JP    5-281428 A    10/1993
(Continued)

OTHER PUBLICATIONS

Notification of Transmittal of Translation of the International Preliminary Report on Patentability (Form PCT/IB/338) issued in counterpart International Application No. PCT/JP2015/078819 dated May 4, 2017 with Forms PCT/IB/373 and PCT/ISA/237. (9 pages).
(Continued)

*Primary Examiner* — Robert Tavlykaev
(74) *Attorney, Agent, or Firm* — Westerman, Hattori, Daniels & Adrian, LLP

(57) ABSTRACT

An opto-electric hybrid board includes: an electric circuit board including electrical interconnect lines formed on the front surface of an insulation layer; a metal reinforcement layer formed partially on the back surface of the electric circuit board; an optical waveguide W configured to partially overlap the back surface of the electric circuit board E; and an second reinforcement layer formed on the back surface of the electric circuit board E. The second reinforcement layer allows the opto-electric hybrid board to have improved rigidity in a specific region and excellent handleability without incurring optical losses during optical coupling.

8 Claims, 7 Drawing Sheets

(51) Int. Cl.
*G02B 6/13* (2006.01)
*H05K 1/02* (2006.01)

(52) U.S. Cl.
CPC .......... *G02B 6/4281* (2013.01); *G02B 6/4231* (2013.01); *H05K 1/02* (2013.01)

(58) Field of Classification Search
USPC .......................................................... 385/14
See application file for complete search history.

(56) References Cited

U.S. PATENT DOCUMENTS

| | | | |
|---|---|---|---|
| 9,046,646 | B2 | 6/2015 | Tsujita et al. |
| 9,265,141 | B2 | 2/2016 | Inoue et al. |
| 9,297,958 | B2 | 3/2016 | Tsujita et al. |
| 2009/0269704 | A1 | 10/2009 | Hodono |
| 2010/0195850 | A1 | 8/2010 | Akino |
| 2010/0316335 | A1 | 12/2010 | Furuyama |
| 2011/0129182 | A1* | 6/2011 | Yamamoto ............... G02B 6/43 385/14 |
| 2011/0222815 | A1* | 9/2011 | Hamana ............... G02B 6/4214 385/14 |
| 2012/0045168 | A1 | 2/2012 | Uemura et al. |
| 2012/0183253 | A1 | 7/2012 | Yasuda et al. |
| 2012/0237158 | A1 | 9/2012 | Inoue et al. |
| 2013/0243370 | A1* | 9/2013 | Tsujita ..................... G02B 6/43 385/14 |
| 2013/0243371 | A1 | 9/2013 | Tsujita et al. |
| 2014/0147076 | A1* | 5/2014 | Tsujita ................. H05K 1/0274 385/14 |

FOREIGN PATENT DOCUMENTS

| | | |
|---|---|---|
| JP | 2009-265342 A | 11/2009 |
| JP | 2010-183330 A | 8/2010 |
| JP | 2010-266598 A | 11/2010 |
| JP | 2010-276676 A | 12/2010 |
| JP | 2010-286777 A | 12/2010 |
| JP | 2012-42731 A | 3/2012 |
| JP | 2012-150223 A | 8/2012 |
| JP | 2012-163649 A | 8/2012 |
| JP | 2012-194401 A | 10/2012 |
| JP | 2013-195532 A | 9/2013 |
| JP | 2014-106355 A | 6/2014 |

OTHER PUBLICATIONS

International Search Report dated Dec. 28, 2015, issued in counterpart application No. PCT/JP2015/078819. (2 pages).
Office Action dated Jun. 19, 2018, issued in counterpart Japanese Application No. 2014-217132, with English machine translation. (7 pages).
Office Action dated Jan. 7, 2019, issued in counterpart Taiwanese Application No. 104133249, with English translation. (10 pages).
Office Action dated Dec. 27, 2018, issued in counterpart CN Application No. 201580053229.4. (8 pages).

* cited by examiner

Related Art

OPTO-ELECTRIC HYBRID BOARD AND METHOD OF MANUFACTURING SAME

TECHNICAL FIELD

The present invention relates to an opto-electric hybrid board including an electric circuit board and an optical wave guide which are stacked together, and a method of manufacturing the same.

BACKGROUND ART

With the increase in the amount of transmission information, optical interconnect lines in addition to electrical interconnect lines have been used in recent electronic devices and the like. A large number of opto-electric hybrid boards capable of transmitting electrical signals and optical signals at the same time have been used. As shown in FIG. 11, a known example of such opto-electric hybrid boards has a structure in which an electric circuit board E includes an insulation layer 1 made of polyimide and the like and serving as a substrate, and electrical interconnect lines 2 of an electrically conductive pattern provided on the front surface of the insulation layer 1, and in which an optical waveguide W is provided on the back surface of the insulation layer 1, with a metal reinforcement layer M for reinforcement provided therebetween (see PTL 1, for example). The front surface of the electric circuit board E is insulated and protected by a coverlay 3. The metal reinforcement layer M is provided with through holes 5 and 5' for optical coupling between the optical waveguide W and an optical element (not shown) to be mounted on the front surface of the electric circuit board E. The optical waveguide W includes three layers: an under cladding layer 6; a core 7 serving as an optical path; and an over cladding layer 8.

There is a difference in coefficient of linear expansion between the insulation layer 1 and the optical waveguide W provided on the back surface thereof. If the insulation layer 1 and the optical waveguide W are directly stacked together, the difference in coefficient of linear expansion therebetween causes stresses and slight bending in the optical waveguide W due to ambient temperature, resulting in increased light propagation losses. The metal reinforcement layer M is provided to avoid such increased light propagation losses. In accordance with trends toward a decrease in the size of electronic devices and an increase in the degree of integration thereof, the opto-electric hybrid boards have been required to have flexibility in recent years for use in small spaces and in movable sections such as hinges. For the increase in flexibility of an opto-electric hybrid board in which the metal reinforcement layer M is interposed for the provision of the optical waveguide W, it has been proposed to partially remove the metal reinforcement layer M itself to cause the cladding layers of the optical waveguide W to enter the sites where the metal reinforcement layer M is removed, thereby increasing the flexibility (see PTL 2, for example).

RELATED ART DOCUMENT

Patent Document

PTL 1: JP-A-2009-265342
PTL 2: JP-A-2013-195532

SUMMARY OF INVENTION

Unfortunately, while a portion of such an opto-electric hybrid board where interconnect lines extend is required to have a high degree of flexibility, an optical coupling portion with an optical element mounted thereon in the same opto-electric hybrid board and a portion of the same opto-electric hybrid board for connection to other members through a connector member attached thereto are required to be as rigid as possible from the viewpoint of handleability. Under the current circumstances, these portions tend to have insufficient rigidity. It is hence strongly desirable to increase the rigidity of these portions so as to prevent these portions from being influenced by warpage and thermal deformation during handling and during repeated use.

The requirement to increase the flexibility of the opto-electric hybrid board is met by removing the metal reinforcement layer M as much as possible in a region where the flexibility is required. It can be considered that the requirement to increase the rigidity in a predetermined area is met by increasing the thickness of the metal reinforcement layer M itself. However, the increase in the thickness of the metal reinforcement layer M increases the length of the optical path for optical coupling (the distance of movement in the through holes 5 and 5' shown in FIG. 11). This results in the increase in optical losses during the optical coupling, and is therefore not preferable. For this reason, it is inevitably difficult to ensure sufficient rigidity in the portion of the opto-electric hybrid board which is used for connection to other members and the like.

In view of the foregoing, it is therefore an object of the present invention to provide an opto-electric hybrid board excellent in handleability and having increased rigidity in a specific region without incurring optical losses during optical coupling, and a method of manufacturing the same.

To accomplish the aforementioned object, a first aspect of the present invention is intended for an opto-electric hybrid board comprising: an electric circuit board having a back surface side, and including an insulation layer having a front surface and an electrical interconnect line provided on the front surface of the insulation layer; an optical waveguide; and a metal reinforcement layer, the metal reinforcement layer being formed on a portion of the back surface side of the electric circuit board, the optical waveguide being configured to overlap a portion of the back surface side of the electric circuit board, the opto-electric hybrid board further comprising a second reinforcement layer formed on the back surface side of the electric circuit board. In particular, a second aspect of the present invention is intended for the opto-electric hybrid board wherein the second reinforcement layer is formed in an area where the optical waveguide is not formed on the back surface side of the electric circuit board.

In particular, the optical waveguide includes an under cladding layer, a core layer and an over cladding layer; and a third aspect of the present invention is intended for the opto-electric hybrid board wherein the second reinforcement layer is made of the same material as cladding layers of the optical waveguide, and a fourth aspect of the present invention is intended for the opto-electric hybrid board wherein the second reinforcement layer is made of a metal plate or a fiber reinforced resin plate.

A fifth aspect of the present invention is intended for a method of manufacturing an opto-electric hybrid board. The method comprises the steps of: forming an insulation layer on the front surface of a metal reinforcement layer and forming an electrical interconnect line on the front surface of the insulation layer to provide an electric circuit board; removing an unnecessary portion of the metal reinforcement layer to partially uncover a back surface of the electric circuit board in the removed portion; forming an optical waveguide configured to overlap a portion of the back surface side of the electric circuit board; and forming a second reinforcement layer on the back surface side of the electric circuit board. In particular, a sixth aspect of the present invention is intended for the method of manufacturing an opto-electric hybrid board, wherein the second reinforcement layer is formed in an area where the optical waveguide is not formed on the back surface side of the electric circuit board.

In particular, a seventh aspect of the present invention is intended for the method of manufacturing an opto-electric hybrid board, wherein: the step of forming the optical waveguide includes the step of forming an under cladding layer, a core layer and an over cladding layer in the order named in a stacked manner; a lower portion of the second reinforcement layer is formed on the back surface side of the electric circuit board of the same material as the under cladding layer when the under cladding layer is formed; and an upper portion of second reinforcement layer is formed on the lower portion of the second reinforcement layer of the same material as the over cladding layer when the over cladding layer is formed, whereby the second reinforcement layer is provided.

In particular, an eighth aspect of the present invention is intended for the method of manufacturing an opto-electric hybrid board, wherein the second reinforcement layer is provided by affixing a metal plate or a fiber reinforced resin plate to the back surface side of the electric circuit board after the step of forming the optical waveguide is completed.

In the opto-electric hybrid board according to the present invention, the new second reinforcement layer separate from the conventionally used metal reinforcement layer is provided in a predetermined region where increased rigidity is desired on the back surface side of the electric circuit board. In the present invention, the back surface of the electric circuit board refers to a surface opposite to the electrical interconnect line, relative to the insulation layer having the electrical interconnect line provided on the front surface thereof, and the back surface side of the electric circuit board refers to a surface side opposite to the electrical interconnect line, relative to the insulation layer having the electrical interconnect line provided on the front surface thereof.

According to this configuration, the thickness of the metal reinforcement layer is in such a range that the optical losses during the optical coupling do not create a problem and in consideration of a balance between required flexibility and rigidity. The second reinforcement layer is provided in the portion where the formation of only the metal reinforcement layer is insufficient, whereby the rigidity of that portion is improved. This eliminates the need to increase the thickness of the metal reinforcement layer to thereby improve the rigidity, so that the optical losses during the optical coupling are not increased. The second reinforcement layer is provided in a specific area where high rigidity is required. Thus, the opto-electric hybrid board has high rigidity in an optical coupling portion and a portion for connection to the connector while having flexibility as a whole to achieve the incorporation thereof into an electronic device and the operation for connection to the connector with reliability. Also, the high rigidity of the portion for mounting of a chip and the like and the portion for connection to the connector allows the opto-electric hybrid board to be less susceptible to warpage and thermal deformation to maintain the stable quality thereof even after long-term use in environments where the opto-electric hybrid board is subjected to loads and temperature.

In particular, the opto-electric hybrid board according to the present invention wherein the second reinforcement layer is formed in an area where the optical waveguide is not formed on the back surface side of the electric circuit board is preferable because the rigidity of the surroundings of the optical waveguide is improved without exerting influence on the optical waveguide.

In particular, the opto-electric hybrid board according to the present invention wherein the second reinforcement layer is made of the same material as the cladding layers of the optical waveguide eliminates the need to separately prepare and mount the second reinforcement layer. The second reinforcement layer is obtained at the same time that the optical waveguide is formed on the back surface side of the electric circuit board. This provides advantages in that the second reinforcement layer is formed easily, when having a fine shape, to provide high manufacturing efficiency.

Further, in particular, the opto-electric hybrid board according to the present invention wherein the second reinforcement layer is made of a metal plate or a fiber reinforced resin plate is advantageous in that the degree of rigidity is easily designed because the material and thickness are selectable as appropriate depending on the required rigidity.

The method of manufacturing an opto-electric hybrid board according to the present invention is capable of manufacturing the opto-electric hybrid board according to the present invention with high efficiency.

DESCRIPTION OF EMBODIMENTS

Next, an embodiment according to the present invention will now be described in detail with reference to the drawings. It should be noted that the present invention is not limited to this embodiment.

Figure 1A:
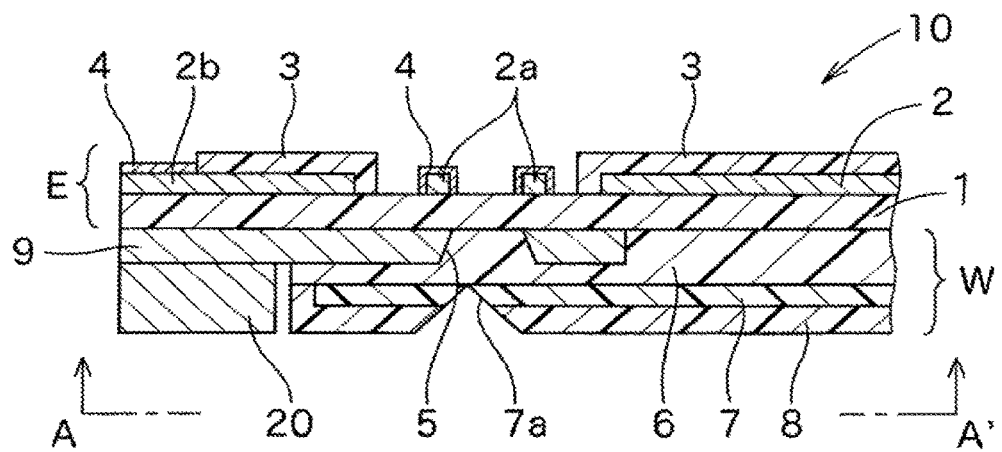
FIG. 1A is a schematic partial vertical sectional view of an opto-electric hybrid board according to one embodiment of the present invention.
Figure 1B:
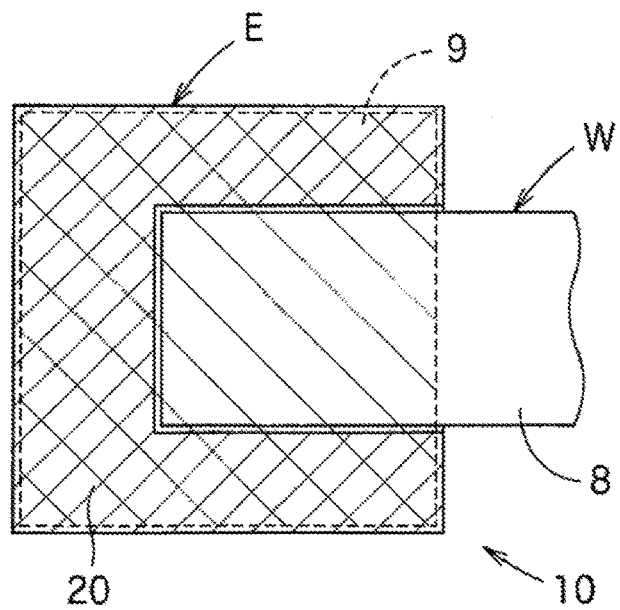
FIG. 1B is a view as seen in the direction of the arrows A-A' of FIG. 1A.

FIG. 1A is a schematic partial vertical sectional view of an opto-electric hybrid board according to one embodiment of the present invention, and FIG. 1B is a view as seen in the direction of the arrows A-A' of FIG. 1A. This opto-electric hybrid board 10 includes: an electric circuit board E including an insulation layer 1 and electrical interconnect lines 2 provided on the front surface of the insulation layer 1; and an optical waveguide W provided on the back surface of the insulation layer 1.

In the electric circuit board E, the electrical interconnect lines 2 including optical element mounting pads 2a, a connector mounting pad 2b, other pads for mounting variable elements, grounding electrodes (not shown) and the like are formed on the front surface of the insulation layer 1 made of polyimide and the like. The electrical interconnect lines 2 except the pads 2a and the like are insulated and protected by a coverlay 3 made of polyimide and the like. The front surface of the pads 2a and the like not protected by the coverlay 3 is covered with an electroplated layer 4 made of gold, nickel and the like.

The optical waveguide W provided on the back surface of the insulation layer 1 includes an under cladding layer 6, a core 7 formed in a predetermined pattern on the front surface (the lower surface as seen in FIG. 1) of the under cladding layer 6, and an over cladding layer 8 integral with the front surface of the under cladding layer 6 while covering the core 7.

A portion of the core 7 corresponding to the optical element mounting pads 2a of the electric circuit board E is in the form of an inclined surface at 45 degrees with respect to the direction in which the core 7 extends. The inclined surface serves as a light reflecting surface 7a. The light reflecting surface 7a functions to change the direction of light propagated in the core 7 by 90 degrees to cause the light to enter a light-receiving portion of an optical element or to change the direction of light exiting from a light-emitting portion of an optical element by 90 degrees to cause the light to enter the core 7.

A metal reinforcement layer 9 for reinforcing the opto-electric hybrid board 10 is provided between the electric circuit board E and the optical waveguide W. The metal reinforcement layer 9 is patterned except where flexibility is required. The metal reinforcement layer 9 is provided with a through hole 5 for ensuring an optical path between the core 7 and the optical element. The under cladding layer 6 extends into the through hole 5. In FIG. 1B, the through hole 5 is not shown, and an area where the metal reinforcement layer 9 is formed is shaded by means of widely spaced diagonal lines extending from top left to bottom right (the same applies to the subsequent figures).

A second reinforcement layer 20 is formed on a portion of the back surface of the metal reinforcement layer 9 where the optical waveguide W is not formed, and is configured to surround the optical waveguide W from three directions, as shown in FIG. 1B. An area where the second reinforcement layer 20 is formed is shaded by means of narrowly spaced diagonal lines extending from bottom left to top right (the same applies to the subsequent figures). The second reinforcement layer 20 achieves a great improvement in the rigidity of the portion of the opto-electric hybrid board 10 where the optical waveguide W is not formed to thereby suppress the occurrence of deformation due to warpage or heat in this portion, as compared with the portion of the opto-electric hybrid board 10 where only the metal reinforcement layer 9 is formed. This is a striking feature of the present invention.

The second reinforcement layer 20 may be made of any material that improves the rigidity of the portion of the opto-electric hybrid board 10 where the second reinforcement layer 20 is formed, such as resin and metal. In this instance, the second reinforcement layer 20 is made of the same material as the under cladding layer 6 and the over cladding layer 8 of the optical waveguide W, and is formed at the same time that the optical waveguide W is formed, which will be described later.

Next, a method of manufacturing the opto-electric hybrid board will be described (with reference to FIGS. 2A to 2D and FIGS. 3A to 3D).

First, the metal reinforcement layer 9 of a planar configuration is prepared. A photosensitive insulating resin including polyimide and the like is applied to the front surface of the metal reinforcement layer 9 to form the insulation layer 1 having a predetermined pattern by a photolithographic process (with reference to FIG. 2A). The insulation layer 1 has a thickness in the range of 3 to 50 μm, for example. Examples of a material for the formation of the metal reinforcement layer 9 include stainless steel, copper, silver, aluminum, nickel, chromium, titanium, platinum and gold. In particular, stainless steel is preferable from the viewpoint of rigidity and the like. Although depending on the material of the metal reinforcement layer 9, the thickness of the metal reinforcement layer 9 is in the range of 10 to 70 μm, for example, when stainless steel is used. When the thickness of the metal reinforcement layer 9 is less than 10 μm, there is apprehension that a sufficient reinforcing effect is not provided. When the thickness of the metal reinforcement layer 9 is greater than 70 μm, there is apprehension that an increase in the distance that light travels in the through hole 5 of the metal reinforcement layer 9 (with reference to FIG. 1A) results in an increase in optical losses.

Figure 2A:
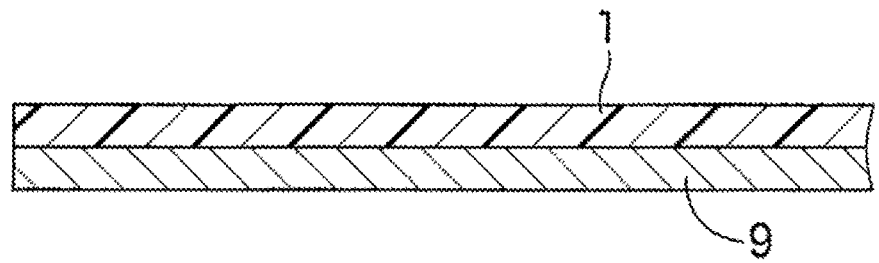
FIGS. 2A to 2D are illustrations showing the steps of producing an electric circuit board in a method of manufacturing the opto-electric hybrid board.
Figure 2B:
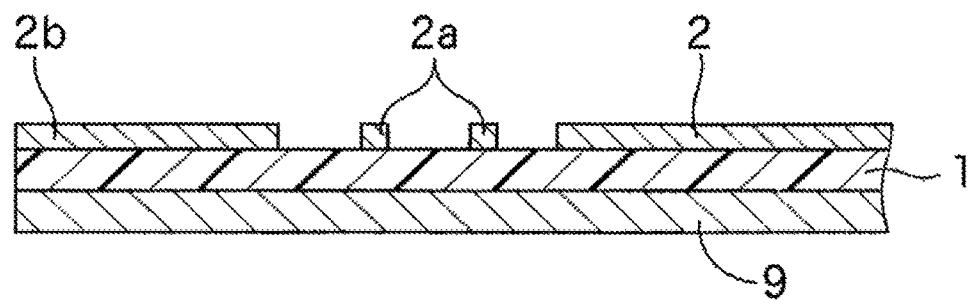

Next, as shown in FIG. 2B, the electrical interconnect lines 2 (including the optical element mounting pads 2a, the connector mounting pad 2b, other pads, grounding electrodes and the like; the same shall apply hereinafter) are formed on the front surface of the insulation layer 1 by a semi-additive process, for example. This process is as follows. First, a metal film (not shown) made of copper, chromium and the like is formed on the front surface of the insulation layer 1 by sputtering, electroless plating or the like. This metal layer serves as a seed layer (a layer serving as a basis material for the formation of an electroplated layer) for a subsequent electroplating process. Then, a photosensitive resist (not shown) is laminated to the opposite surfaces of a laminate comprised of the metal reinforcement layer 9, the insulation layer 1 and the seed layer. Thereafter, a photolithographic process is performed to form holes having the pattern of the electrical interconnect lines 2 in the photosensitive resist on the side where the seed layer is formed, so that surface portions of the seed layer are uncovered at the bottoms of the holes. Next, electroplating is performed to form an electroplated layer made of copper and the like in a stacked manner on the surface portions of the seed layer uncovered at the bottoms of the holes. Then, the photosensitive resist is stripped away using an aqueous sodium hydroxide solution and the like. Thereafter, a portion of the seed layer on which the electroplated layer is not formed is removed by soft etching. Laminate portions comprised of the remaining seed layer and the electroplated layer become the electrical interconnect lines 2.

Figure 2C:
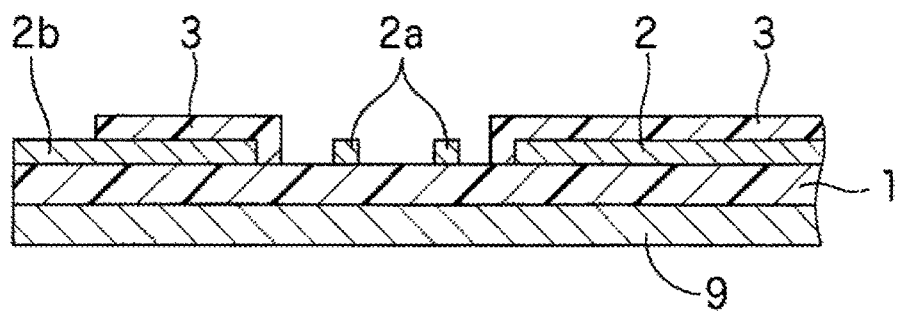

Next, as shown in FIG. 2C, a photosensitive insulating resin including polyimide and the like is applied to portions of the electrical interconnect lines 2 other than the optical element mounting pads 2a, the connector mounting pad 2b and the like to form the coverlay 3 by a photolithographic process.

Figure 2D:
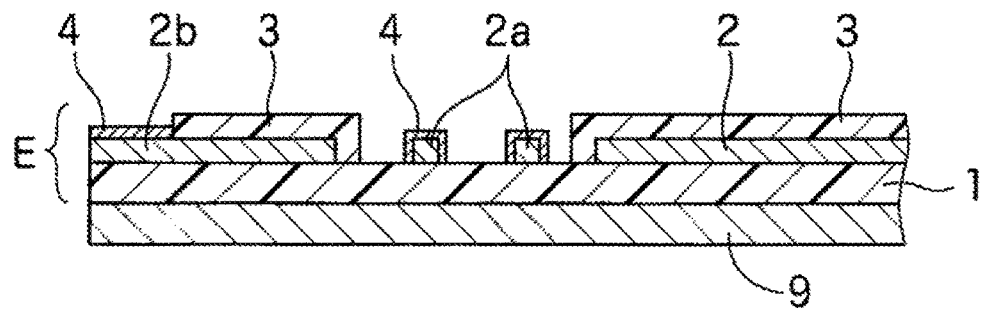

Then, as shown in FIG. 2D, the electroplated layer 4 is formed on the front surfaces of the optical element mounting pads 2a, the connector mounting pad 2b and the like which are not covered with the coverlay 3. In this manner, the electric circuit board E is formed.

Next, a photosensitive resist is laminated to the opposite surfaces of a laminate comprised of the metal reinforcement layer 9 and the electric circuit board E. Thereafter, holes are formed by a photolithographic process in portions of the photosensitive resist on the back surface (the surface opposite from the electric circuit board E) of the metal reinforcement layer 9 which correspond to a portion not requiring the metal reinforcement layer 9 and a future through hole portion for the optical path, so that the back surface of the metal reinforcement layer 9 is partially uncovered.

Figure 3A:
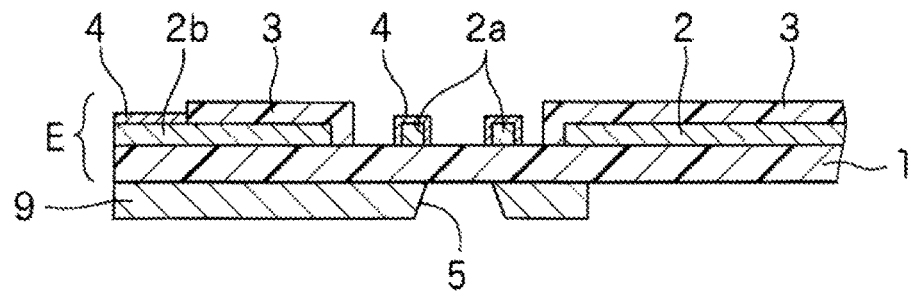
FIGS. 3A to 3D are illustrations showing the steps of producing an optical waveguide in the method of manufacturing the opto-electric hybrid board.

Then, the uncovered portions of the metal reinforcement layer 9 are removed by etching using an aqueous etching solution for the metal material of the metal reinforcement layer 9 (for example, an aqueous ferric chloride solution is used as the aqueous etching solution when the metal reinforcement layer 9 is a stainless steel layer), so that the insulation layer 1 is uncovered in the sites where the metal reinforcement layer 9 is removed. Thereafter, the photosensitive resist is stripped away using an aqueous sodium hydroxide solution and the like. Thus, as shown in FIG. 3A, the metal reinforcement layer 9 is formed only in a region where the reinforcement is required, and the through hole 5 for the optical path is formed at the same time.

Figure 3B:
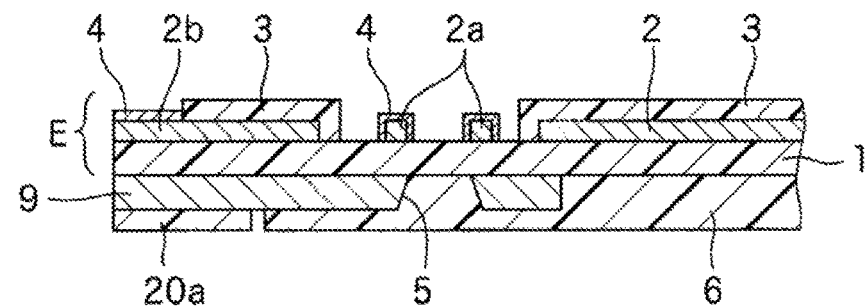

For the formation of the optical waveguide W (with reference to FIG. 1A) on the back surface of the insulation layer 1 (back surface of the metal reinforcement layer 9 in the portion where the metal reinforcement layer 9 is formed), a photosensitive resin that is the material for the formation of the under cladding layer 6 is applied to the back surfaces (the lower surfaces as seen in the figure) of the insulation layer 1 and the metal reinforcement layer 9, as shown in FIG. 3B. Thereafter, the applied layer is exposed to irradiation light. This exposure cures the applied layer to form the under cladding layer 6. In this process, a portion 20a (referred to hereinafter as a "lower portion 20a") serving as a lower portion of the second reinforcement layer 20 (with reference to FIGS. 1A and 1B) is formed using the material for the formation of the under cladding layer 6 at the same time. The under cladding layer 6 and the lower portion 20a of the second reinforcement layer 20 may be formed into a predetermined pattern by a photolithographic process. The under cladding layer 6 is formed to enter and fill the through hole 5 for the optical path in the metal reinforcement layer 9. The under cladding layer 6 has a thickness (thickness as measured from the back surface of the insulation layer 1) generally greater than the thickness of the metal reinforcement layer 9. Of course, the lower portion 20a of the second reinforcement layer 20 has the same thickness as the under cladding layer 6. A series of operations for the formation of the optical waveguide W are performed while the back surface of the insulation layer 1 on which the metal reinforcement layer 9 is oriented upward. However, the orientation is shown unchanged in the figure.

Figure 3C:
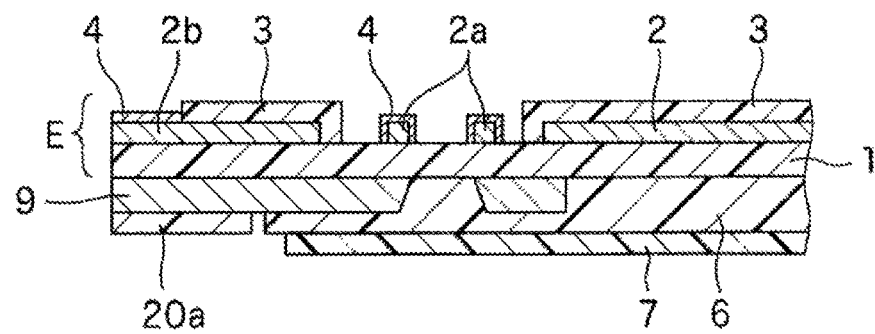

Next, as shown in FIG. 3C, the core 7 having a predetermined pattern is formed on the front surface (the lower surface as seen in the figure) of the under cladding layer 6 by a photolithographic process. The core 7 has a thickness in the range of 3 to 100 μm, for example, and a width in the range of 3 to 100 μm, for example. An example of the material for the formation of the core 7 includes a photosensitive resin similar to that for the under cladding layer 6, and the material used herein has a refractive index higher than that of the material for the formation of the under cladding layer 6 and the over cladding layer 8 to be described below. The adjustment of the refractive indices may be made, for example, by adjusting the selection of the types of the materials for the formation of the under cladding layer 6, the core 7 and the over cladding layer 8, and the composition ratio thereof.

Figure 3D:
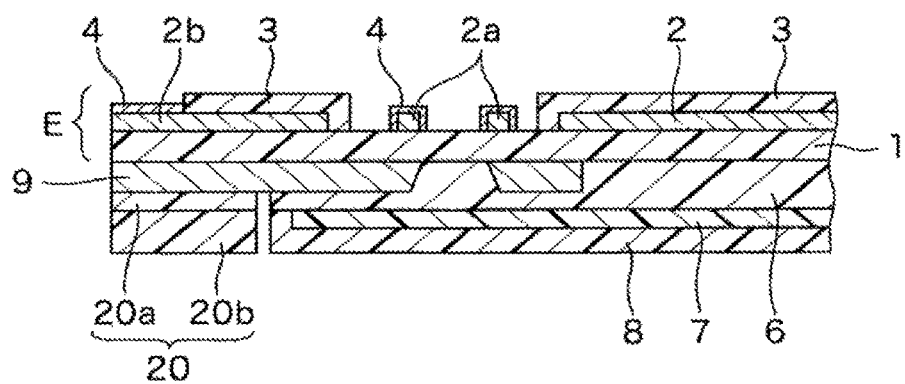

Next, as shown in FIG. 3D, the over cladding layer 8 is formed on the front surface (the lower surface as seen in the figure) of the under cladding layer 6 by a photolithographic process so as to cover the core 7. In this process, a portion 20b (referred to hereinafter as an "upper portion 20b") serving as an upper portion of the second reinforcement layer 20 is formed using the material for the formation of the over cladding layer 8 at the same time. In this manner, the optical waveguide W is formed, and the second reinforcement layer 20 is formed. The over cladding layer 8 has a thickness (thickness as measured from the front surface of the under cladding layer 6) not less than that of the core 7 and not greater than 300 μm. Of course, the upper portion 20b of the second reinforcement layer 20 has the same thickness as the over cladding layer 8. An example of the material for the formation of the over cladding layer 8 and the upper portion 20b of the second reinforcement layer 20 includes a photosensitive resin similar to that for the under cladding layer 6.

Specific composition examples of the materials for the formation of the optical waveguide W are as follows.

<Materials for Formation of Under Cladding Layer 6, Over Cladding Layer 8 and Second Reinforcement Layer 20 (Lower Portion 20a plus Upper Portion 20b)>

20 parts by weight of an epoxy resin containing an alicyclic skeleton (EHPE 3150 available from Daicel Chemical Industries, Ltd.)

80 parts by weight of a liquid long-chain bifunctional semi-aliphatic epoxy resin (EXA-4816 available from DIC Corporation)

2 parts by weight of a photo-acid generator (SP170 available from ADEKA Corporation)

40 parts by weight of ethyl lactate (available from Musashino Chemical Laboratory, Ltd.)

<Material for Formation of Core 7>

50 parts by weight of o-cresol novolac glycidyl ether (YDCN-700-10 available from Nippon Steel & Sumikin Chemical Co., Ltd.)

50 parts by weight of bisphenoxyethanolfluorene diglycidyl ether (OGSOL EG available from Osaka Gas Chemicals Co., Ltd.)

1 part by weight of a photo-acid generator (SP170 available from ADEKA Corporation)

50 parts by weight of ethyl lactate (available from Musashino Chemical Laboratory, Ltd.)

An inclined surface inclined at 45 degrees with respect to the direction in which the core 7 extends is formed in a predetermined portion of the thus formed optical waveguide W by laser beam machining, cutting and the like to provide the reflecting surface 7a (with reference to FIG. 1A) for optical coupling to the optical element to be mounted on the front surface of the electric circuit board E. Then, necessary members are mounted, for example, by mounting the optical element on the pads 2a of the electrical interconnect lines 2 provided on the front surface of the electric circuit board E.

In this manner, the opto-electric hybrid board 10 shown in FIGS. 1A and 1B in which the second reinforcement layer 20 is formed on the back surface of the electric circuit board E is provided. In this opto-electric hybrid board 10, the thickness of the metal reinforcement layer 9 is in such a range that the optical losses during the optical coupling do not create a problem and in consideration of a balance between flexibility and rigidity of the opto-electric hybrid board 10. The second reinforcement layer 20 is provided in the portion where the formation of only the metal reinforcement layer 9 is insufficient and higher rigidity is required. Therefore, this opto-electric hybrid board 10 has high rigidity in an optical coupling portion and a portion for connection to the connector while having flexibility as a whole to achieve the incorporation thereof into an electronic device and the operation for connection to the connector with reliability. Also, the high rigidity of the portion for mounting of a chip and the like and the portion for connection to the connector allows the opto-electric hybrid board 10 to be less susceptible to warpage and thermal deformation to maintain the stable quality thereof even after long-term use in environments where the opto-electric hybrid board 10 is subjected to loads and temperature.

Further, the second reinforcement layer 20 is made of the same material as the cladding layers of the optical waveguide W. This is advantageous in high manufacturing efficiency because the second reinforcement layer 20 may be formed at the same time that the under cladding layer 6 and the over cladding layer 8 are patterned even when the second reinforcement layer 20 has a complicated and fine shape as seen in plan view.

Figure 4:
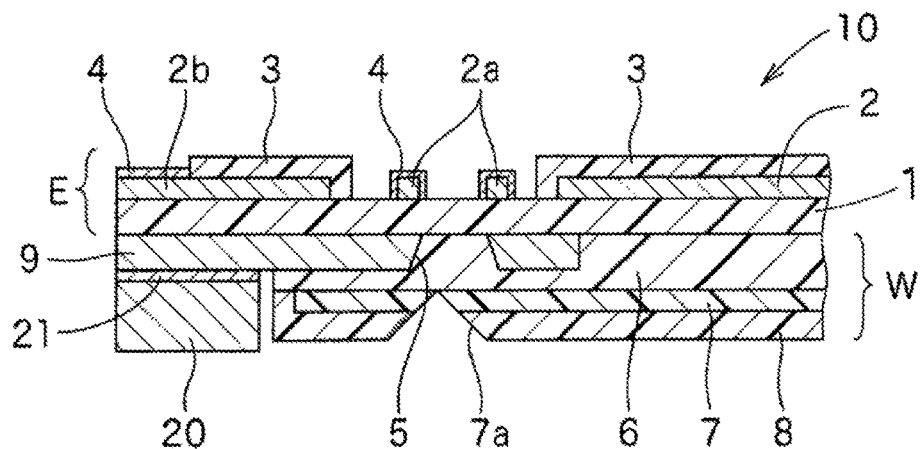
FIG. 4 is an illustration of another example of the opto-electric hybrid board according to the present invention.

In the aforementioned instance, the second reinforcement layer 20 is formed at the same time that the under cladding layer 6 and the over cladding layer 8 of the optical waveguide W are formed. However, the method of forming the second reinforcement layer 20 is not limited to this. For example, after the opto-electric hybrid board 10 is formed without forming the second reinforcement layer 20, an additionally prepared plate material for the second reinforcement layer 20 may be affixed to the back surface of the electric circuit board E, with an adhesive layer 21 therebetween, as shown in FIG. 4. The aforementioned process of affixing the second reinforcement layer 20 may be performed either before or after the optical element is mounted on the front surface of the electric circuit board E.

The aforementioned method need not employ the same material as the cladding material of the optical waveguide W as the material for the formation of the second reinforcement layer 20 but may employ various resin materials and metal materials. In particular, a material thin enough to be made in the form of a thin plate and having high rigidity is preferably used. Examples of the material for the formation of the second reinforcement layer 20 include: metal materials such as stainless steel, copper, silver, aluminum, nickel, chromium, titanium, platinum and gold; and fiber reinforced resins such as glass-fiber reinforced resins and carbon-fiber reinforced resins. Of these materials, a stainless steel plate, a glass epoxy plate and the like are, in particular, optimally used. The material of the adhesive layer 21 for affixing the second reinforcement layer 20 to the back surface of the electric circuit board E may be selected, as appropriate, depending on the material of the second reinforcement layer 20.

The thickness of the second reinforcement layer 20 is determined by the required rigidity and the type of the material thereof. When a stainless steel plate is used, the thickness of the second reinforcement layer 20 is in the range of 20 to 2000 μm, for example. When a glass epoxy plate is used, the thickness of the second reinforcement layer 20 is in the range of 100 to 3000 μm, for example. The process of affixing the second reinforcement layer 20 to the electric circuit board E is preferably performed, for example, by forming the adhesive layer 21 on a release sheet, stacking a metal layer, a fiber reinforced resin layer or the like on the adhesive layer 21, punching the resultant laminate into a predetermined shape, removing the release sheet from the punched laminate, and then affixing the punched laminate in a predetermined position on the back surface of the electric circuit board E.

Figure 5A:
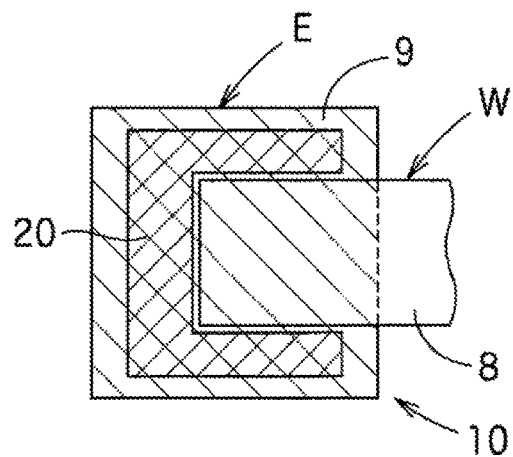
FIGS. 5A and 5B are illustrations of modifications of a second reinforcement layer in the opto-electric hybrid board.

The region in which the second reinforcement layer 20 provided on the back surface of the electric circuit board E is formed in the present invention is not limited to that of the aforementioned instance. The second reinforcement layer 20 may be disposed in various configurations in accordance with regions where rigidity is required. In the aforementioned instance, the second reinforcement layer 20 is formed around the optical waveguide W in such a configuration that the outside shape of the metal reinforcement layer 9 provided on the back surface of the electric circuit board E coincides with the outside shape of the second reinforcement layer 20, as shown in FIG. 1B. Alternatively, as shown in FIG. 5A, the second reinforcement layer 20 formed on the back surface of the electric circuit board E may be slightly smaller in size than the metal reinforcement layer 9 to improve the rigidity near the center around the optical waveguide W.

Figure 5B:
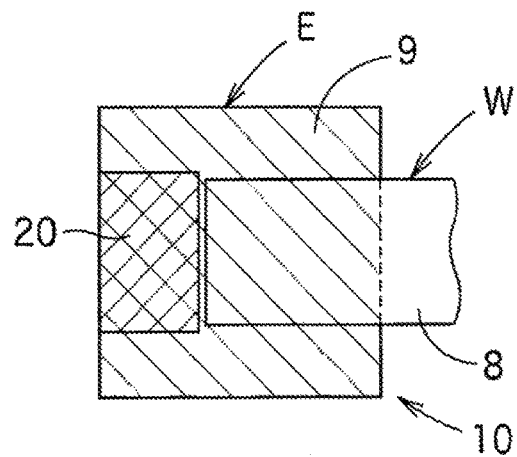

Also, as shown in FIG. 5B, the second reinforcement layer 20 may be formed only in a portion lying between a longitudinal front edge of the optical waveguide W and an edge of the electric circuit board E, rather than surrounding the optical waveguide W on three sides, to thereby improve the rigidity of this portion.

Figure 6A:
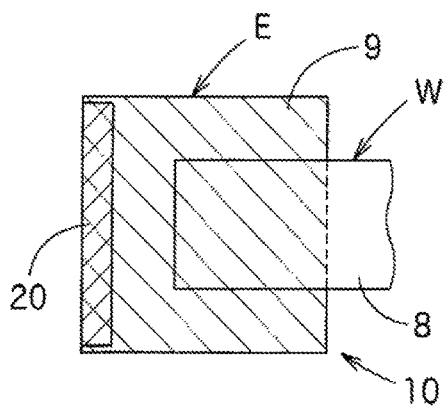
FIGS. 6A to 6C are illustrations of modifications of the second reinforcement layer.

Also, as shown in FIG. 6A, the second reinforcement layer 20 may be formed in a strip-shaped configuration along the front edge of the electric circuit board E. Alternatively, the second reinforcement layer 20 may be formed in a strip-shaped configuration along each side edge of the electric circuit board E along the length of the optical waveguide W, as shown in FIG. 6B, or may be formed in a strip-shaped configuration along only one side edge of the electric circuit board E along the length of the optical waveguide W, as shown in FIG. 6C, to improve the rigidity of the side edge portion(s) in a required direction, thereby improving the handleability thereof.

Figure 7A:
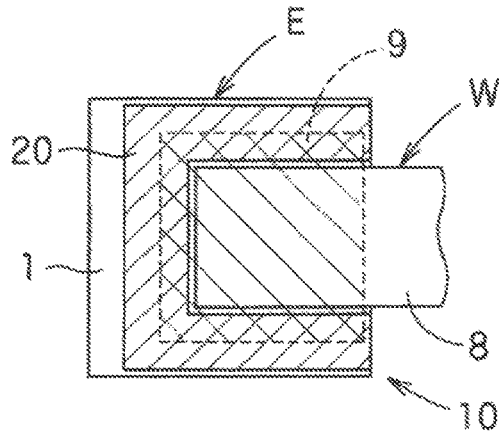
FIGS. 7A and 7B are illustrations of modifications of the second reinforcement layer.
Figure 7B:
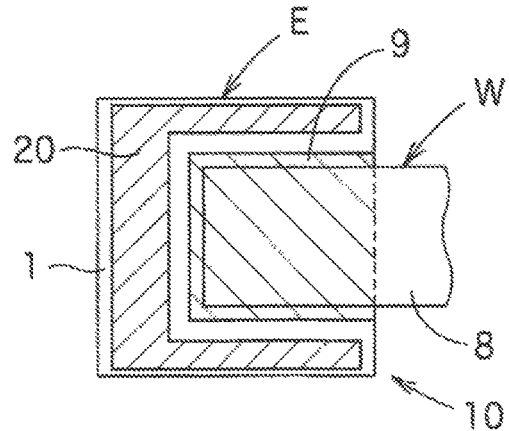

When the outside shape of the metal reinforcement layer 9 on the back surface of the electric circuit board E is smaller than that of the electric circuit board E, the second reinforcement layer 20 may be formed to extend over the metal reinforcement layer 9 and the insulation layer 1 of the electric circuit board E, as shown in FIG. 7A, or may be formed directly on the back surface of the insulation layer 1 so as not to overlap the metal reinforcement layer 9, as shown in FIG. 7B.

Figure 6B:
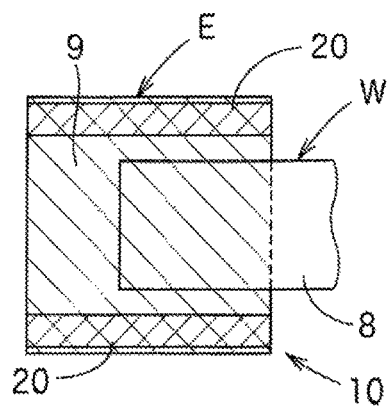
Figure 6C:
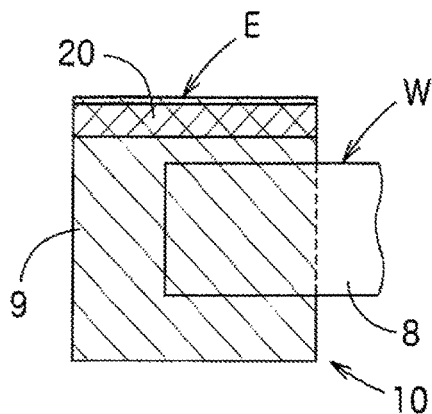
Figure 8A:
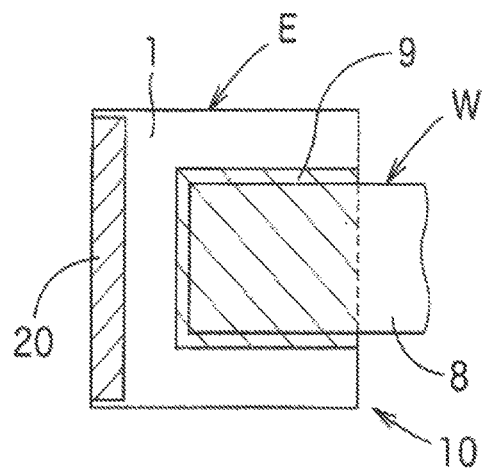
FIGS. 8A to 8C are illustrations of modifications of the second reinforcement layer.
Figure 8B:
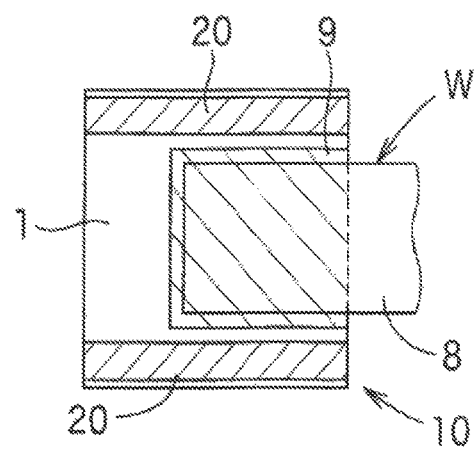
Figure 8C:
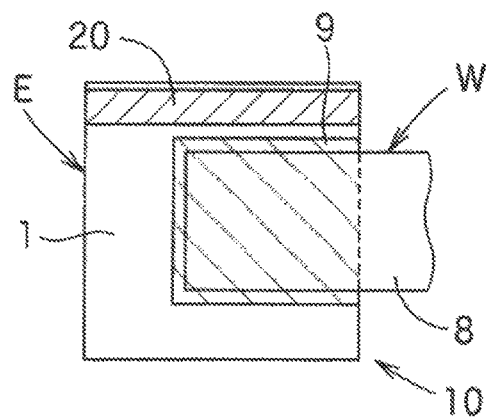

When the second reinforcement layer 20 is formed directly on the back surface of the insulation layer 1 as mentioned above, the second reinforcement layer 20 may be formed in a strip-shaped configuration along an end edge or along one or each side edge of the electric circuit board E (with reference to FIGS. 8A to 8C) as in the instances shown in FIGS. 6A to 6C.

Figure 9:
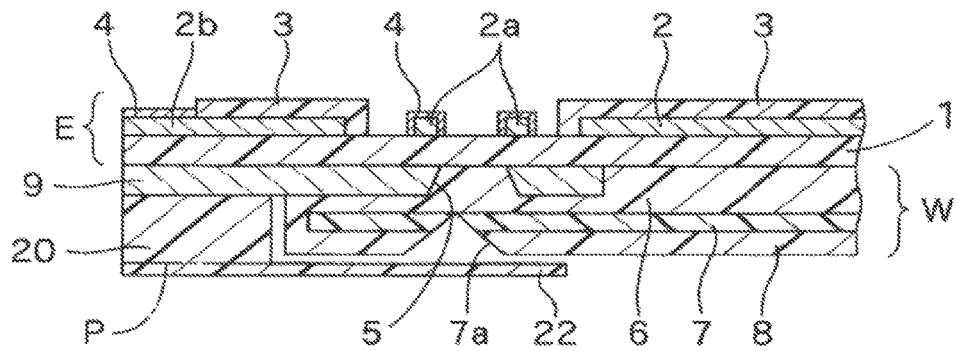
FIG. 9 is an illustration of another modification of the second reinforcement layer in the opto-electric hybrid board.
Figure 10A:
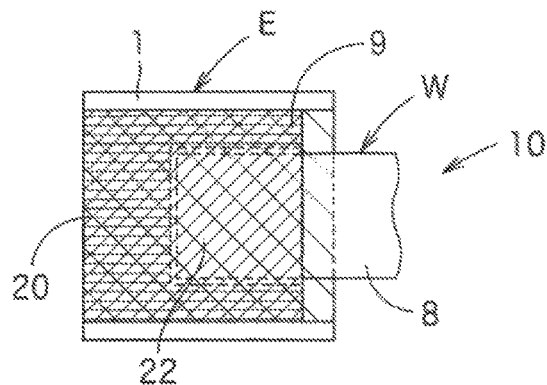
FIGS. 10A to 10C are illustrations of modifications of the second reinforcement layer.
Figure 10B:
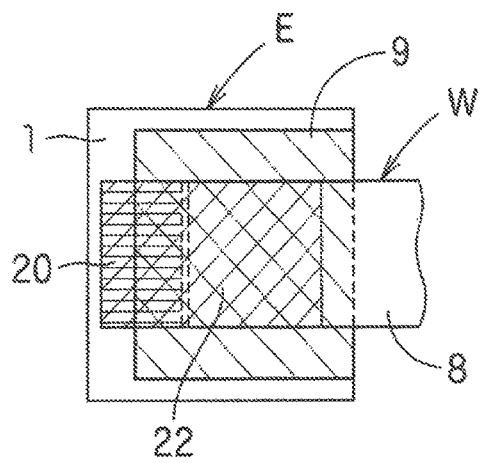
Figure 10C:
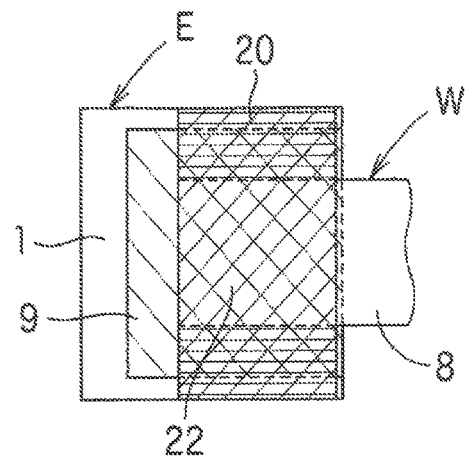
Figure 11:
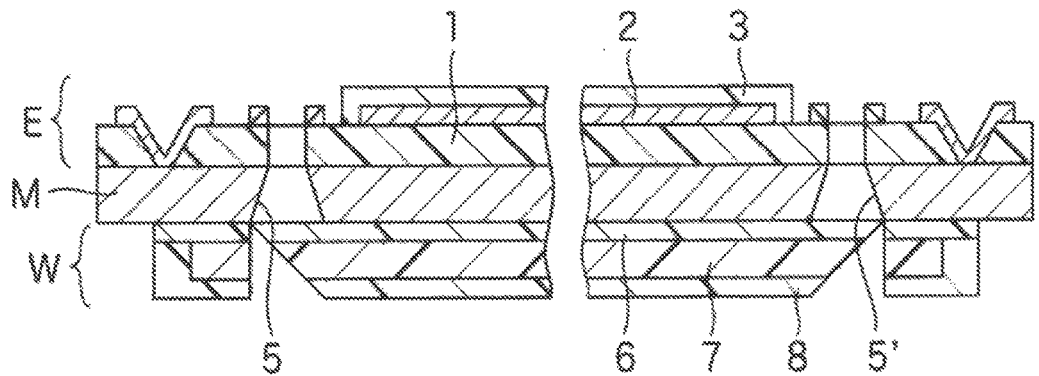
FIG. 11 is a schematic vertical sectional view of an example of a conventional opto-electric hybrid board.

The second reinforcement layer 20 formed to surround the periphery of the optical waveguide W as in the instance shown in FIGS. 1A and 1B may be provided with a cover portion 22 extending sidewise (in a direction so as to overlap the optical waveguide W) from over a surface thereof opposed to the optical waveguide W, as shown in FIG. 9. As shown in plan view in FIG. 10A, the second reinforcement layer 20 provided with the cover portion 22 not only surrounds the periphery of the optical waveguide W but also covers the vicinity of the optical coupling portion of the optical waveguide W entirely in a pocket. This further improves the rigidity of the vicinity of the optical coupling portion. In FIGS. 10A to 10C, an area in which the second reinforcement layer 20 is joined to the metal reinforcement layer 9 or the insulation layer 1 (an area other than the cover portion 22) is shaded by means of narrowly spaced parallel lines extending in a horizontal direction. Thus, this opto-electric hybrid board 10 has further improved handleability and more excellent quality stability. In addition, the cover portion 22 is capable of keeping the reflecting surface 7a (with reference to FIG. 9) on the optical waveguide W side and its surroundings clean. This further suppresses the optical losses.

The cover portion 22 may be configured to extend in cantilevered fashion from the second reinforcement layer 20 provided on one front end of the optical waveguide W, as shown in FIG. 10B, or may be configured to extend over two second reinforcement layers 20 provided on opposite sides of the optical waveguide W, as shown in FIG. 10C.

The second reinforcement layer 20 provided with the cover portion 22 is produced in a manner to be described below. For example, a base portion below (in the figure, above) a dash-and-dot line P shown in FIG. 9 is formed using the same cladding material at the same time that the optical waveguide W is formed as described above or is formed by a method of affixing a plate-like reinforcement layer material thereto, with the adhesive layer 21 (not illustrated in FIG. 9) therebetween. Thereafter, a plate member serving as the cover portion 22 is affixed onto (in the figure, to beneath) the base portion. This results in the second reinforcement layer 20 provided with the intended cover portion 22.

Of course, a plate member in the form of the second reinforcement layer 20 provided with the cover portion 22 may be prepared by laser beam machining and directly affixed to the back side of the electric circuit board E, with the adhesive layer 21 therebetween.

The thickness of the cover portion 22 may be set as appropriate in consideration of a balance with the thickness of the entire second reinforcement layer 20 and shape retaining performance. For example, the thickness of the entire second reinforcement layer 20 is in the range of 100 to 3000 μm, and the thickness of the cover portion 22 is in the range of 50 to 2950 μm.

In the aforementioned instances, the second reinforcement layer 20 (a portion of the second reinforcement layer 20 other than the cover portion 22, when provided) is formed using an area where the optical waveguide W is not formed on the back surface of the electric circuit board E. However, the second reinforcement layer 20 need not necessarily be disposed in the area where the optical waveguide W is not formed. For example, the second reinforcement layer 20 may be provided to extend over the area where the optical waveguide W is not formed and the surface where the optical waveguide W is formed on the back surface of the electric circuit board E. Alternatively, the second reinforcement layer 20 may be formed on the surface where the optical waveguide W is formed in a stacked manner. However, it should be noted that, when the second reinforcement layer 20 is formed in a stacked manner on the optical waveguide W, the core 7 of the optical waveguide W and the second reinforcement layer 20 are disposed so as not to overlap each other as seen in plan view.

Further, in the instance shown in FIGS. 1A and 1B, the outside shape of the optical waveguide W is defined by both the under cladding layer 6 and the over cladding layer 8. However, the outside shape of the optical waveguide W may be defined by only the over cladding layer 8 or the core 7. When the second reinforcement layer 20 is formed at the same time as the optical waveguide W, the second reinforcement layer 20 may be formed at the same time as the over cladding layer 8 or the core 7.

Although specific forms in the present invention have been described in the aforementioned embodiment, the aforementioned embodiment should be considered as merely illustrative and not restrictive. It is contemplated that various modifications evident to those skilled in the art could be made without departing from the scope of the present invention.

The present invention is applicable to the provision of an opto-electric hybrid board which has an electric circuit board portion less susceptible to warpage and thermal deformation and which has excellent handleability and stable quality.

REFERENCE SIGNS LIST

E Electric circuit board
W Optical waveguide
1 Insulation layer
2 Electrical interconnect lines
9 Metal reinforcement layer
10 Opto-electric hybrid board
20 Second reinforcement layer

The invention claimed is:

1. An opto-electric hybrid board comprising:
an electric circuit board including an insulation layer and an electrical interconnect line provided on a front surface of the insulation layer;
an optical waveguide; and
a metal reinforcement layer,
wherein the metal reinforcement layer is formed on a portion of a back surface side of the electric circuit board,
wherein the optical waveguide is configured to overlap a portion of the back surface side of the electric circuit board,
wherein the opto-electric hybrid board further comprises a second reinforcement layer formed on the back surface side of the electric circuit board,
wherein the second reinforcement layer is formed only in an area where the optical waveguide is not formed on the back surface side of the electric circuit board with a gap present between an outer surface of the optical waveguide and the second reinforcement layer,
wherein a portion of at least one of the metal reinforcement layer and the second reinforcement layer overlaps with a portion of the optical waveguide in a side view along a longitudinal direction thereof, and
wherein the metal reinforcement layer is provided with a through hole for optical coupling between the optical waveguide and an optical element to be mounted on the front surface of the electric circuit board.

2. The opto-electric hybrid board according to claim 1, wherein the optical waveguide includes an under cladding layer, a core layer and an over cladding layer; and
wherein the second reinforcement layer is made of a same material as the under cladding layer and the over cladding layer of the optical waveguide.

3. The opto-electric hybrid board according to claim 1, wherein the second reinforcement layer is made of a metal plate or a fiber reinforced resin plate.

4. The opto-electric hybrid board according to claim 1, wherein the metal reinforcement layer is at least partially disposed between the second reinforcement layer and the electric circuit board.

5. A method of manufacturing an opto-electric hybrid board, comprising the steps of:

forming an insulation layer on a front surface of a metal reinforcement layer and forming an electrical interconnect line on a front surface of the insulation layer to provide an electric circuit board;

removing an unnecessary portion of the metal reinforcement layer to partially uncover a back surface of the electric circuit board in the removed portion;

forming an optical waveguide configured to overlap a portion of the back surface side of the electric circuit board; and forming a second reinforcement layer on the back surface side of the electric circuit board, the second reinforcement layer being formed only in an area where the optical waveguide is not formed on the back surface side of the electric circuit board with a gap present between an outer surface of the optical waveguide and the second reinforcement layer, wherein the metal reinforcement layer, second reinforcement layer and optical waveguide are formed such that a portion of at least one of the metal reinforcement layer and the second reinforcement layer overlaps with a portion of the optical waveguide in a side view along a longitudinal direction thereof, and wherein the metal reinforcement layer is provided with a through hole for optical coupling between the optical waveguide and an optical element to be mounted on the front surface of the electric circuit board.

6. The method of manufacturing an opto-electric hybrid board according to claim 5, wherein the step of forming the optical waveguide includes steps of forming an under cladding layer, a core layer and an over cladding layer in the order named in a stacked manner;

wherein a lower portion of the second reinforcement layer is formed on the back surface side of the electric circuit board of a same material as the under cladding layer when the under cladding layer is formed; and wherein an upper portion of second reinforcement layer is formed on the lower portion of the second reinforcement layer of a same material as the over cladding layer when the over cladding layer is formed, whereby the second reinforcement layer is provided.

7. The method of manufacturing an opto-electric hybrid board according to claim 5, wherein the second reinforcement layer is provided by affixing a metal plate or a fiber reinforced resin plate to the back surface side of the electric circuit board after the step of forming the optical waveguide is completed.

8. The method of manufacturing an opto-electric hybrid board according to claim 5, wherein the metal reinforcement layer is at least partially disposed between the second reinforcement layer and the electric circuit board.

* * * * *